(12) United States Patent
Choi

(10) Patent No.: US 8,681,831 B2
(45) Date of Patent: Mar. 25, 2014

(54) LIGHT OUTPUTTING DEVICE AND LIGHT SCANNING UNIT HAVING THE SAME

(75) Inventor: Jin-kyung Choi, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 281 days.

(21) Appl. No.: 12/135,261

(22) Filed: Jun. 9, 2008

(65) Prior Publication Data

US 2009/0074017 A1 Mar. 19, 2009

(30) Foreign Application Priority Data

Sep. 17, 2007 (KR) .................. 10-2007-0094163

(51) Int. Cl.
*H01S 5/00* (2006.01)
*H01S 5/026* (2006.01)

(52) U.S. Cl.
CPC ............. *H01S 5/0264* (2013.01); *H01S 5/0262* (2013.01)
USPC .................. 372/50.21; 372/50.124; 372/50.1; 372/24

(58) Field of Classification Search
CPC .............................. H01S 5/0264; H01S 5/0262
USPC ............................ 372/50.124, 50.21, 24, 50.1
See application file for complete search history.

(56) References Cited

U.S. PATENT DOCUMENTS

| | | | | |
|---|---|---|---|---|
| 5,574,744 | A * | 11/1996 | Gaw et al. | 372/50.21 |
| 5,606,572 | A * | 2/1997 | Swirhun et al. | 372/96 |
| 5,751,748 | A | 5/1998 | Uejima et al. | |
| 6,023,485 | A * | 2/2000 | Claisse et al. | 372/50.21 |
| 6,091,754 | A * | 7/2000 | Jiang et al. | 372/50.11 |
| 6,320,891 | B1 * | 11/2001 | Seko | 372/50.21 |
| 6,535,538 | B1 | 3/2003 | Lee et al. | |
| 2005/0180481 | A1 * | 8/2005 | Kaneko et al. | 372/50.21 |
| 2007/0008997 | A1 | 1/2007 | Mochizuki et al. | |
| 2007/0147459 | A1 | 6/2007 | Ueki | |
| 2008/0013583 | A1 * | 1/2008 | Imai | 372/50.21 |

FOREIGN PATENT DOCUMENTS

| | | |
|---|---|---|
| KR | 1999-0043106 | 6/1999 |
| KR | 2001-0045739 | 6/2001 |
| KR | 2007-0006606 | 1/2007 |
| KR | 2007-0066864 | 6/2007 |

OTHER PUBLICATIONS

Chinese Office Action dated May 14, 2011 in Appln. No. 200810213585.X.
English Abstract of Korean Registration No. 100265858, Issued Jun. 17, 2000.
Chinese Office Action mailed Mar. 21, 2012 in Application No. 200810213585.X.
Korean Notice of Allowance mailed Mar. 29, 2012 in Application No. 10-2007-0094163.

* cited by examiner

*Primary Examiner* — Tod T Van Roy
(74) *Attorney, Agent, or Firm* — Staas & Halsey LLP

(57) ABSTRACT

A light outputting device includes, a substrate, a vertical cavity surface emitting laser (VCSEL) provided on a surface of the substrate, including a light emitting surface which emits a light, and a monitoring detector provided on the light emitting surface of the VCSEL to receive a part of the light emitted from the VCSEL so as to monitor the amount of the light emitted from the VCSEL.

9 Claims, 9 Drawing Sheets

LIGHT OUTPUTTING DEVICE AND LIGHT SCANNING UNIT HAVING THE SAME

CROSS-REFERENCE TO RELATED APPLICATION

This application claims all benefits accruing under 35 U.S.C. §119 from Korean Patent Application No. 2007-94163, filed on Sep. 17, 2007 in the Korean Intellectual Property Office, the disclosure of which is incorporated herein by reference.

BACKGROUND OF THE INVENTION

1. Field of the Invention

Aspects of the present invention relate to a light outputting device integrally provided with a monitoring detector and a light scanning unit having the same, and more particularly, to a light outputting device having a compact configuration and an improved ability to detect a signal used to automatically adjust the amount of light emitted from a vertical cavity surface emitting laser (VCSEL) and a light scanning unit having the same.

2. Description of the Related Art

In general, a vertical cavity surface emitting laser (VCSEL) emits a laser beam in a direction through layers of a wafer, that is, in a vertical direction which is perpendicular to horizontal layer surfaces, unlike an edge emitting laser. Accordingly, since a plurality of VCSELs are capable of being integrated on a signal wafer, a light outputting device using the VCSEL can easily perform scanning operations in two dimensions. Accordingly, the light outputting device using the VCSEL may be widely used for many optical applications, such as laser printing, laser scanning, medical equipment, optical communications, etc.

The light outputting device using the VCSEL should be monitored to automatically control the intensity of a light beam outputted from the VCSEL. Since the VCSEL emits a light beam in one direction unlike the edge emitting laser, the light beam can be used to perform both an intended function of the light beam, such as scanning, and can further be used in a monitoring operation.

In general, to perform the monitoring, a monitoring detector may be provided on an inner part or an outer part of the light outputting device. If the monitoring detector is provided on the outer part of the light outputting device, an additional optical element, such as, a half plate, is necessary to divide the light beam outputted from the VCSEL into two paths. Thus, there is a disadvantage that a manufacturing cost of the light outputting device is increased.

FIG. 1 is a schematic sectional view illustrating a conventional light outputting device having a monitoring detector provided on an inner part of the light outputting device. As shown in FIG. 1, the conventional light outputting device includes a substrate 1, a VCSEL 3 provided on the substrate 1, and a light output control unit 5 to control a light output of the VCSEL 3. The light output control unit 5 includes a monitoring detector 6 provided on the substrate 1 to be adjacent to the VCSEL 3, a housing 7 on which a transparent cover glass 7a is disposed, and an auto power controller (APC) 9. The housing 7 is disposed on the substrate 1 to surround the VCSEL 3 and the monitoring detector 6. The cover glass 7a is positioned on a proceeding path of the light emitted from the VCSEL 3 to transmit most of the light emitted from the VCSEL 3 and reflect a part thereof toward the monitoring detector 6.

In the conventional light outputting device, a part of the light emitted from the VCSEL 3 is reflected by the external surface of the cover glass 7a. The monitoring detector 6 receives the reflected light and transmits the reflected light to the APC 9 after a photoelectric converting operation is performed. Accordingly, the light output of the VCSEL 3 can be controlled.

In the light outputting device having the configuration as shown in FIG. 1, since the amount of the light proceeding toward the monitoring detector 6 is not proportional to the amount of the light emitted from the VCSEL 3 due to various "obstructing factors," it is difficult to correctly control the light output. Two of the "obstructing factors" are that (1) a divergent angle of the light emitted from the VCSEL 3 varies depending on a driving current and temperature, and (2) there is a diffused reflection. With respect to factor (1), since the amount of the light proceeding toward the monitoring detector 6 among the total amount of the emitted light varies as the divergent angle of the light emitted from the VCSEL 3 varies, it is difficult to detect the amount of the received light in proportion to the amount of the light emitted from the VCSEL 3. With respect to factor (2), a light beam is diffused as it is reflected by the housing 7 and received by the monitoring detector 6, making it difficult to detect the amount of the received light in proportion to the amount of the light emitted from the VCSEL 3.

Also, not all of the light reflected by the cover glass 7a is reflected toward the monitoring detector 6. Accordingly, the amount of current outputted by the monitoring detector 6 decreases, so that the light output of the VCSEL 3 cannot be normally controlled.

According to another example of the conventional light outputting device, a monitoring detector is provided on the inner part of the light outputting device. A substrate of the VCSEL is manufactured to include the monitoring detector within the substrate. That is, by doping an electrode layer of the monitoring detector with the same semiconductor type as a lower reflecting layer of the VCSEL, the substrate of the VCSEL is layered on the monitoring detector. In this case, since the monitoring detector receives the emitted light transmitted through the lower reflecting layer of the VCSEL, the problems associated with the light outputting device shown in FIG. 1 may be reduced.

However, in this light outputting device according to another example, it is necessary to newly manufacture the substrate. In this case, manufacturers may have difficulty in determining a wafer growth condition despite newly manufacturing the substrate.

SUMMARY OF THE INVENTION

Aspects of the present invention provide a light outputting device to accurately and automatically control a light output without being influenced by a divergent angle variation of a light emitted from a VCSEL or a diffused reflection of an external light, and to minimize a loss of a light beam used to monitor the light output of the VCSEL without changing a substrate configuration.

Another aspect of the present invention provides a light scanning unit to scan a light beam by using at least one VCSEL, and to reduce image inferiority due to a light output difference among multi beams when scanning the multi beams.

Additional aspects of the present invention will be set forth in part in the description which follows and, in part, will be obvious from the description, or may be learned by practice of the present invention.

In accordance with an example embodiment of the present invention, a light outputting device includes a substrate; a vertical cavity surface emitting laser (VCSEL) provided on the substrate, and including a light emitting surface which emits a light; and a monitoring detector provided on the light emitting surface of the VCSEL to receive a part of the light emitted from the VCSEL so as to monitor an amount of the light emitted from the VCSEL.

According to an aspect of the present invention, the monitoring detector may be disposed to cover the entire light emitting surface, and formed with an aperture therein to enable transmission of the light emitted from the light emitting surface.

According to an aspect of the present invention, the monitoring detector may be disposed to cover a designated portion of the light emitting surface.

In accordance with another example embodiment of the present invention, a light outputting device includes a substrate, a plurality of vertical cavity surface emitting lasers (VCSELs) which are respectively provided at a plurality of positions on the substrate, each VCSEL respectively including a light emitting surface which emits a light, an isolator provided to electrically and optically isolate each VCSEL on the substrate, and a monitoring detector provided on the light emitting surface of each VCSEL to receive a part of the light emitted from each VCSEL so as to monitor an amount of the light emitted from the VCSEL.

According to an aspect of the present invention, the monitoring detector includes a plurality of light detecting units which are respectively provided on each light emitting surface of the VCSELs.

According to an aspect of the present invention, each light detecting unit is disposed on the entire light emitting surface of the corresponding VCSEL, and formed with an aperture therein to enable transmission of the light emitted from the light emitting surface.

According to an aspect of the present invention, each light detecting unit is disposed to cover a designated portion of the corresponding light emitting surface of each VCSEL.

According to an aspect of the present invention, the monitoring detector includes at least one light detecting unit which receives the light emitted from at least two of the light emitting surfaces among the light emitting surfaces of the VCSELs.

According to an aspect of the present invention, the light detecting unit is entirely disposed on the at least two light emitting surfaces, and formed with at least two apertures therein corresponding to the at least two light emitting surfaces to enable transmission of the light emitted from the at least two light emitting surfaces.

According to an aspect of the present invention, the light detecting unit is disposed to cover designated portions of each of the at least two light emitting surfaces.

According to an aspect of the present invention, the light outputting device further includes an insulating layer which is interposed between the VCSELs and the monitoring detector to electrically insulate the VCSELs and the monitoring detector, and to transmit the light generated from each of the VCSELs to the monitoring detector.

According to an aspect of the present invention, the light outputting device further includes a metal layer which is provided on the monitoring detector to prevent an external light from entering the monitoring detector.

In accordance with another example embodiment of the present invention, a light scanning unit includes a substrate, a vertical cavity surface emitting laser (VCSEL) provided on a surface of the substrate, and including a light emitting surface which emits a light; a monitoring detector provided on the light emitting surface of the VCSEL to receive a part of the light emitted from the VCSEL so as to monitor an amount of the light emitted from the VCSEL; and a beam deflecting unit which deflects the light emitted from the VCSEL in a main scanning direction of a photosensitive medium.

According to an aspect of the present invention, the monitoring detector is disposed on the entire light emitting surface, and formed with an aperture therein to enable transmission of the light emitted from the light emitting surface.

According to an aspect of the present invention, the monitoring detector is disposed to cover a designated portion of the light emitting surface.

According to another example embodiment of the present invention, a light scanning unit includes a substrate; a plurality of vertical cavity surface emitting lasers (VCSELs) respectively provided at a plurality of positions on a surface of the substrate, each VCSEL including a light emitting surface which emits a light; an isolator to electrically and optically isolate each VCSEL on the substrate; a monitoring detector provided on each light emitting surface of the VCSELs to receive a part of the light emitted from each VCSEL so as to monitor an amount of the light emitted from each VCSEL; and a beam deflecting unit which deflects the light emitted from each of the respective VCSELs in a main scanning direction of a photosensitive medium.

According to an aspect of the present invention, the monitoring detector includes a plurality of light detecting units which are respectively provided on corresponding light emitting surfaces of the plurality of VCSELs.

According to an aspect of the present invention, each light detecting unit is disposed on the entire corresponding light emitting surface, and formed with an aperture therein which enables transmission of the light emitted from the light emitting surface.

According to an aspect of the present invention, each light detecting unit is disposed to cover a designated portion of the corresponding light emitting surface.

According to an aspect of the present invention, the monitoring detector includes at least one light detecting unit which receives the light emitted from at least two of the light emitting surfaces among the light emitting surfaces of the VCSELs.

According to an aspect of the present invention, the light scanning unit further includes an insulating layer which is interposed between the VCSELs and the monitoring detector to electrically insulate the VCSELs and the monitoring detector and to transmit the light generated from each of the VCSELs to the monitoring detector.

According to an aspect of the present invention, the light scanning unit further includes a metal layer which is provided on the monitoring detector to prevent an external light from entering the monitoring detector.

In addition to the example embodiments and aspects as described above, further aspects and embodiments will be apparent by reference to the drawings and by study of the following descriptions.

BRIEF DESCRIPTION OF THE DRAWINGS

A better understanding of the present invention will become apparent from the following detailed description of example embodiments and the claims when read in connection with the accompanying drawings, all forming a part of the disclosure of this invention. While the following written and illustrated disclosure focuses on disclosing example embodiments of the invention, it should be clearly understood that the same is by way of illustration and example only and that the invention is not limited thereto. The spirit and scope of the present invention are limited only by the terms of the appended claims. The following represents brief descriptions of the drawings, wherein:

DETAILED DESCRIPTION OF THE EMBODIMENTS

Figure 1:
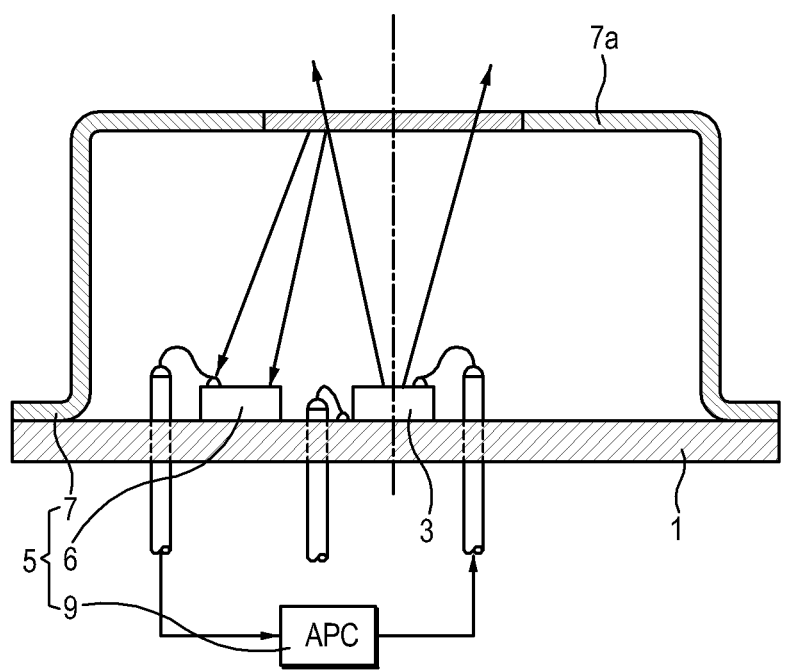
FIG. 1 is a schematic sectional view illustrating a conventional light outputting device.

Reference will now be made in detail to the present embodiments of the present invention, examples of which are illustrated in the accompanying drawings, wherein like reference numerals refer to like elements throughout. The embodiments are described below in order to explain the present invention by referring to the figures.

Figure 2:
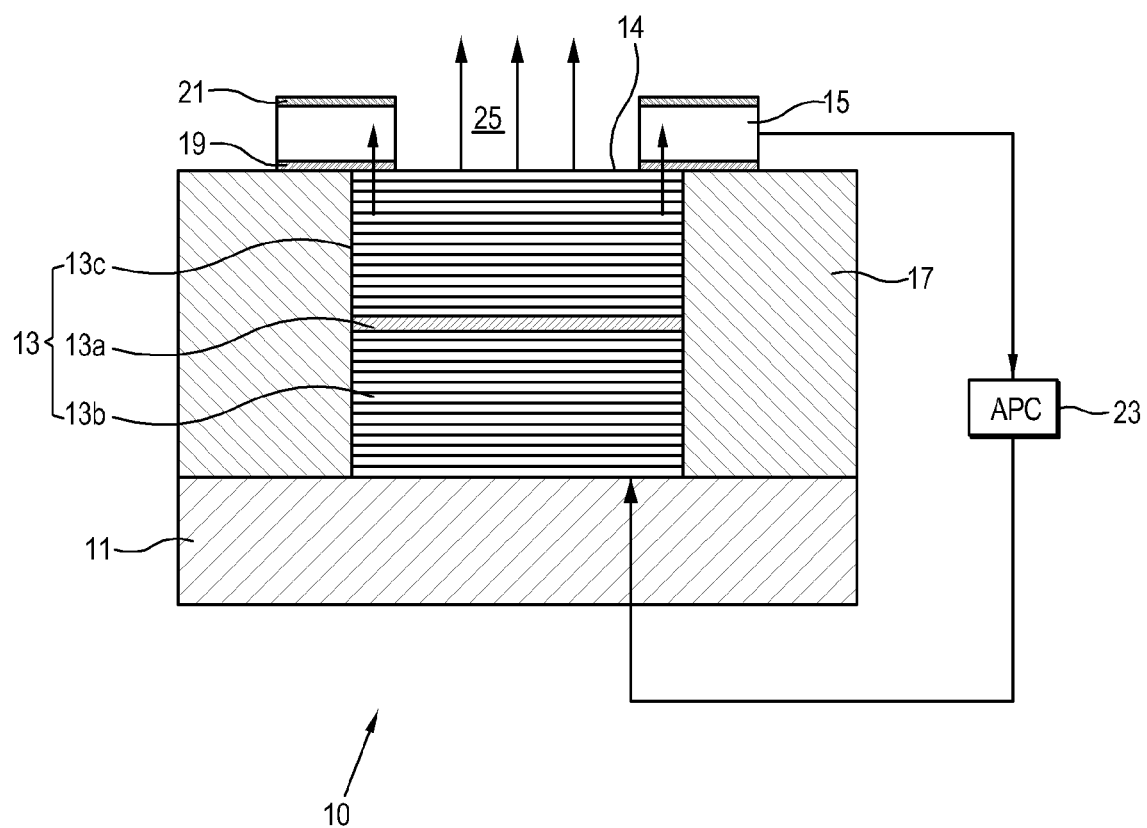
FIG. 2 is a schematic sectional view illustrating a light outputting device according to a first exemplary embodiment of the present invention.

FIG. 2 is a schematic sectional view illustrating a light outputting device 10 according to a first exemplary embodiment of the present invention. As shown in FIG. 2, the light outputting device 10 includes a substrate 11, a vertical cavity surface emitting laser (VCSEL) 13 provided on the substrate 11, and a monitoring detector 15.

The VCSEL 13 includes a light emitting surface 14 through which a light beam is emitted in a vertical direction to the substrate 11. The VCSEL 13 includes an activating layer 13a to generate the light beam, and first and second reflecting layers 13b and 13c respectively positioned on opposite sides above and below the activating layer 13a. The first reflecting layer 13b is positioned on the substrate 11, and forms a resonator together with the second reflecting layer 13c. The configuration of the VCSEL 13 is well known in the art, and thus, a detailed description thereof will be omitted.

The monitoring detector 15 is independently manufactured from the VCSEL 13, and is coupled on the light emitting surface 14. The monitoring detector 15 receives part of a light beam emitted from the VCSEL 13 to monitor an amount of light emitted from the VCSEL 13. That is, the monitoring detector 15 outputs an electrical signal which varies according to the amount of the received light to an auto power controller (APC) 23. According to an aspect of the present invention, the APC 23 is provided between the monitoring detector 15 and the VCSEL 13, and controls the emitted light amount of the VCSEL 13 based on the amount of the emitted light received by the monitoring detector 15. It is understood that the APC 23 is not limited to being provided between the monitoring detector 15 and the VCSEL 13 as shown in FIG. 1, and may instead be disposed in other ways, such as integrally formed with various components of the light outputting device 100.

The monitoring detector 15 is disposed on an upper part of the light emitting surface 14. According to an aspect of the present invention, an aperture 25 is formed on an inner part of the light emitting surface 14, through which the light emitted from the light emitting surface 14 is transmitted. According to an aspect of the present invention, the aperture 25 is formed after the monitoring detector 15 is coupled on the VCSEL 13, however, it is understood that the aperture 25 is not limited to such, and may instead be formed before or during when the monitoring detector 15 is coupled on the VCSEL 13. The aperture 25 may be formed by an etching process. In this case, the aperture 25 may be advantageously formed to a correct position without having to perform a separate alignment operation to form a position of the aperture 25.

Accordingly, most of the light emitted through the light emitting surface 14 is transmitted through the aperture 25, and the remaining portion of the emitted light is received by the monitoring detector 15 through a lower part of the monitoring detector 15 and an inner side wall to which the aperture 25 is formed.

Alternatively, a monitoring detector having a ring shape may be provided, and coupled on the VCSEL 13, instead of having the aperture 25 formed on the light emitting surface 14. Furthermore, according to other aspects of the present invention, the monitoring detector may have various other shapes and sizes, such as ovals, triangles, squares, or combinations thereof.

Figure 6:
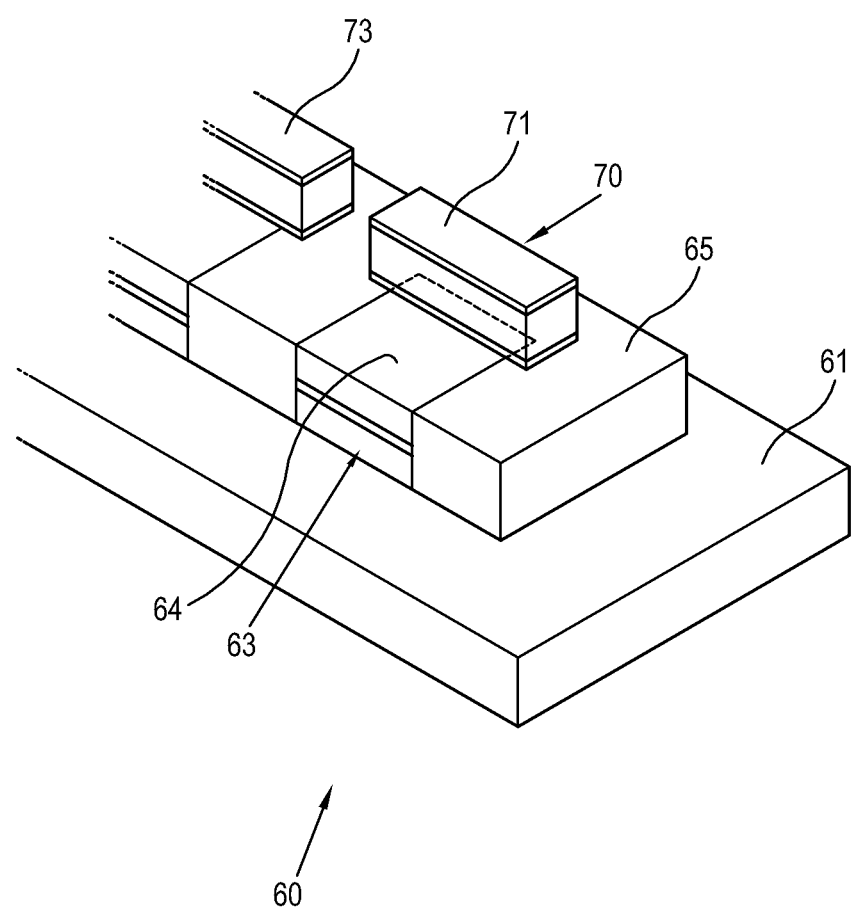
FIG. 6 is a partial perspective view illustrating a light outputting device according to a fourth exemplary embodiment of the present invention.
Figure 7:
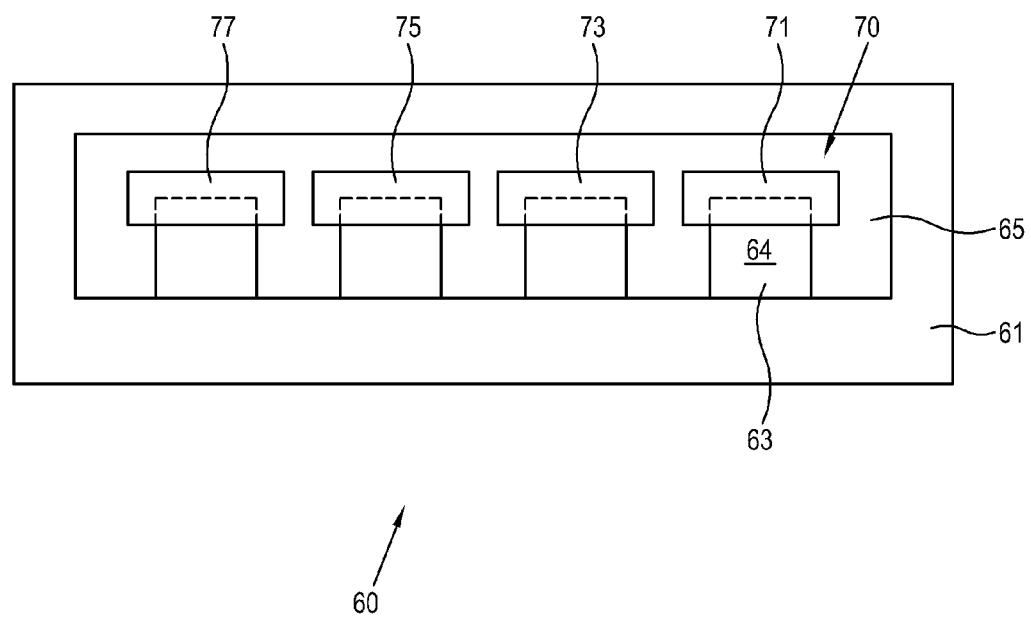
FIG. 7 is a plane view illustrating the light outputting device according to the fourth exemplary embodiment of the present invention.
Figure 8:
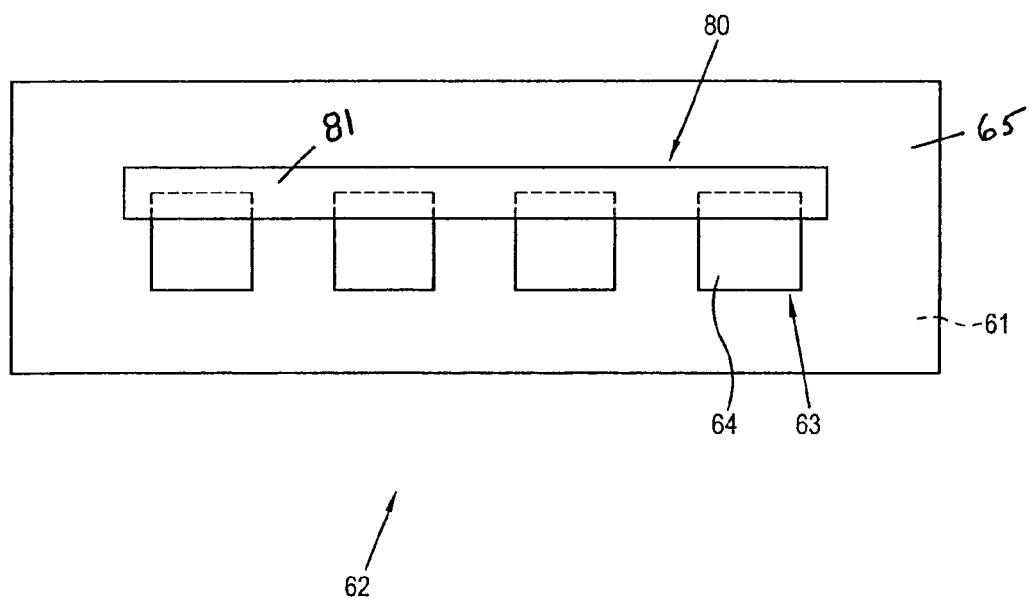
FIG. 8 is a plane view illustrating a light outputting device according to a fifth exemplary embodiment of the present invention.

Also, as shown in FIGS. 6 to 8, the monitoring detector 70 (FIGS. 6 and 7) and 80 (FIG. 8) according to other aspects of the present invention may be disposed to cover an upper surface of the light emitting surface 14.

In the present exemplary embodiment, the VCSEL 13 and the monitoring detector 15 are active elements and respectively include electrodes (not shown). The configurations of the electrodes are well known in the art, and thus, detailed descriptions thereof will be omitted.

Also, the light outputting device 10 shown in FIG. 2 may further include an isolator 17 disposed on the substrate 11. The isolator 17 is provided around the VCSEL 13 on the substrate 11 to electrically and optically isolate the VCSEL 13. Accordingly, the isolated VCSEL 13 is prevented from being influenced by a peripheral environment. Also, an upper surface of the isolator 17 is positioned to be substantially parallel to the same plane as the light emitting surface 14 of the VCSEL 13 to support a lower surface thereof when the monitoring detector 15 is coupled on the VCSEL 13.

Also, the light outputting device 10 shown in FIG. 2 may further include an insulating layer 19 interposed between the VCSEL 13 and the monitoring detector 15. According to an aspect of the present invention, the insulating layer 19 is formed of a material such as polyimide, etc. The insulating layer 19 transmits a light entering the monitoring detector 15, and electrically insulates the VCSEL 13 and the monitoring detector 15. Accordingly, when a part of the light emitted from the VCSEL 13 enters a lower part of the monitoring detector 15, the insulating layer 19 is prevented from influencing the detecting operation performed by the monitoring detector 15.

Also, the light outputting device 10 shown in FIG. 2 may further include a metal layer 21 provided on the monitoring detector 15. The metal layer 21 prevents a diffused reflected light from entering the monitoring detector 15, thereby minimizing an adverse effect of the detecting operation due to an external light.

Figure 3:
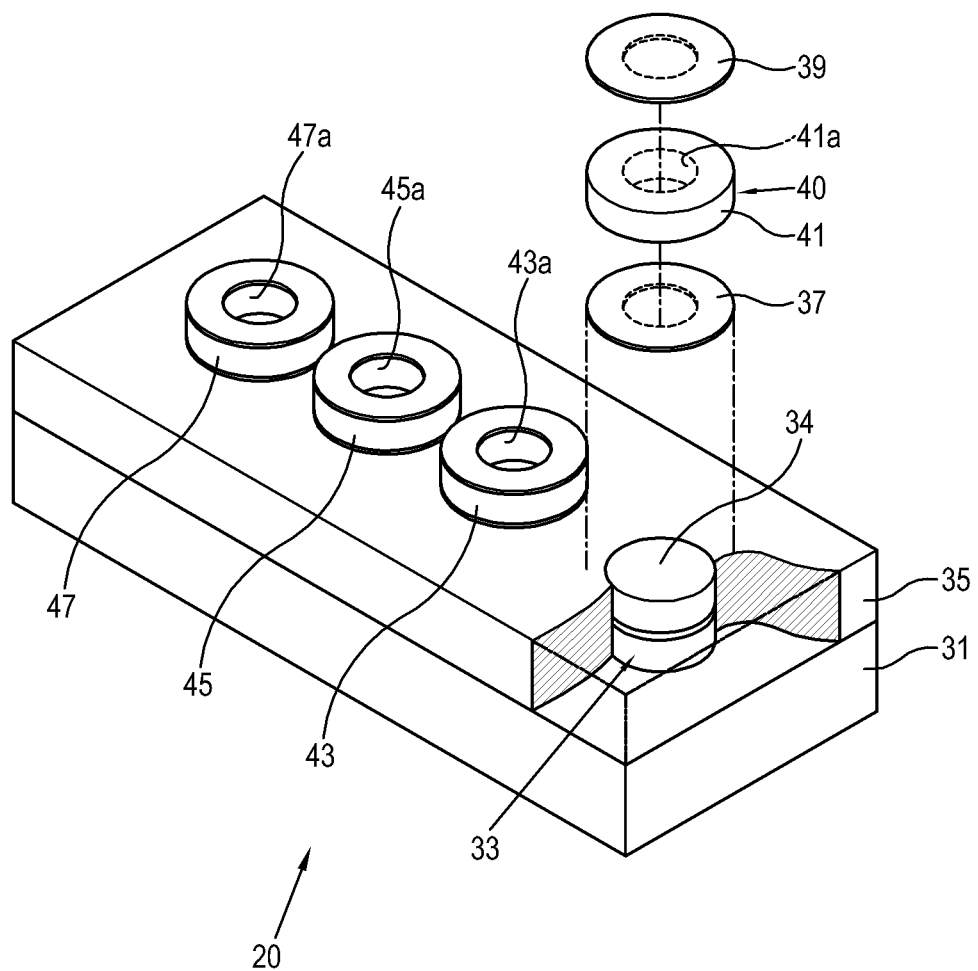
FIG. 3 is a schematic partial exploded perspective view illustrating a light outputting device according to a second exemplary embodiment of the present invention.
Figure 4:
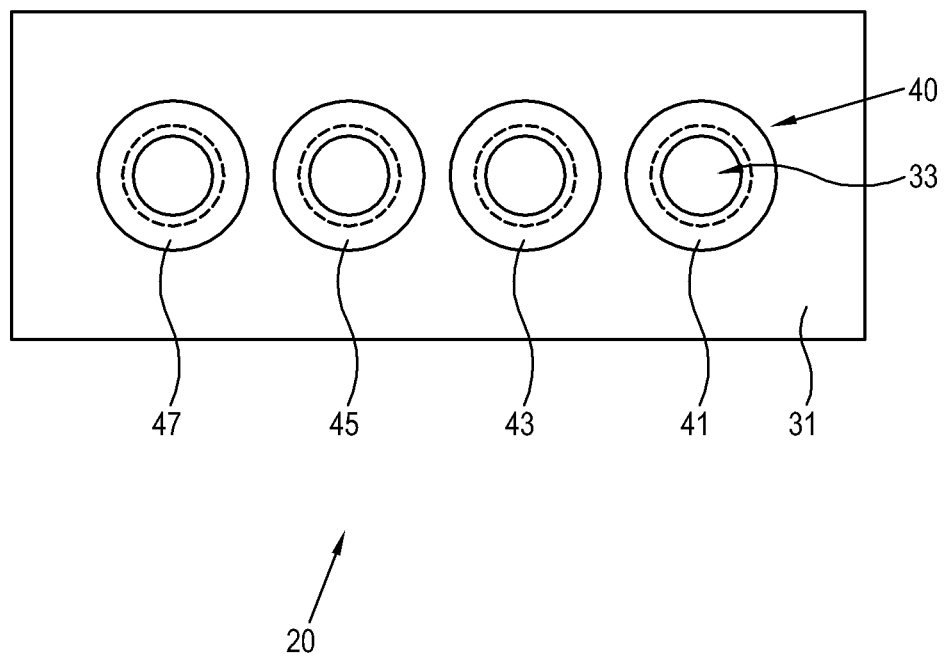
FIG. 4 is a plane view illustrating the light outputting device according to the second exemplary embodiment of the present invention.

FIG. 3 is a schematic partial exploded perspective view illustrating a light outputting device 20 according to a second exemplary embodiment of the present invention, and FIG. 4 is a plane view of the light outputting device 20 shown in FIG. 3. As shown in FIG. 3, the light outputting device 20 includes a substrate 31, a plurality of VCSELs 33 provided on the substrate 31, an isolator 35 electrically and optically isolating each VCSEL 33, and a monitoring detector 40.

The VCSELs 33 are provided at a plurality of positions on the substrate 31 and are distanced from each other. The VCSELs 33 emit lights in a vertical direction which is substantially perpendicular to the horizontally disposed substrate 31. The isolator 35 is provided around the VCSEL 33 on the substrate 31 to electrically and optically isolate each VCSEL 33.

The monitoring detector 40 is provided on a light emitting surface 34 of each VCSEL 33 and the isolator 35. The monitoring detector 40 receives a part of a light beam emitted from each VCSEL 33 to monitor the amount of the emitted light of each VCSEL 33.

The monitoring detector 40 includes a plurality of light detecting units 41, 43, 45 and 47 provided on the light emitting surface 34 of each VCSEL 33. Here, each light detecting unit 41, 43, 45 and 47 is disposed over substantially all of the upper part of the corresponding light emitting surface 34, although may cover less than all of the upper part. Apertures 41a, 43a, 45a and 47a, which the light emitted from the light emitting surface 34 is transmitted through, are respectively formed on inner parts thereof. According to an aspect of the present invention, each aperture 41a, 43a, 45a and 47a is formed by a process known in the art, such as an etching process, etc., after the monitoring detector 40 is coupled to the light emitting surface 34. However, it is understood that the apertures 41a, 43a, 45a and 47a are not limited to being formed by these processes.

Also, the light outputting device 20 shown in FIG. 3 may further include an insulating layer 37 interposed between the plurality of VCSELs 33 and the monitoring detector 40, and a metal layer 39 provided on the monitoring detector 40. The insulating layer 37 and the metal layer 39 may have the same configurations as the above described configurations of the insulating layer 19 and the metal layer 21, and thus, a detailed description thereof will be omitted.

Since the light outputting device 20 as described above is capable of independently receiving the light emitted from each VCSEL 33 by the plurality of light detecting units 41, 43, 45 and 47, the light outputting device 20 concurrently monitors the light output of each of the VCSELs 33. Here, since the ratio of the amount of light received by each light detecting unit 41, 43, 45 and 47 as compared to the amount of light emitted from each VCSEL 33 varies depending on an area by which the light detecting units 41, 43, 45 and 47 cover the light emitting surface 34, a light amount ratio used to monitor the emitted light amount can be freely determined by adjusting the covering area.

Figure 5:
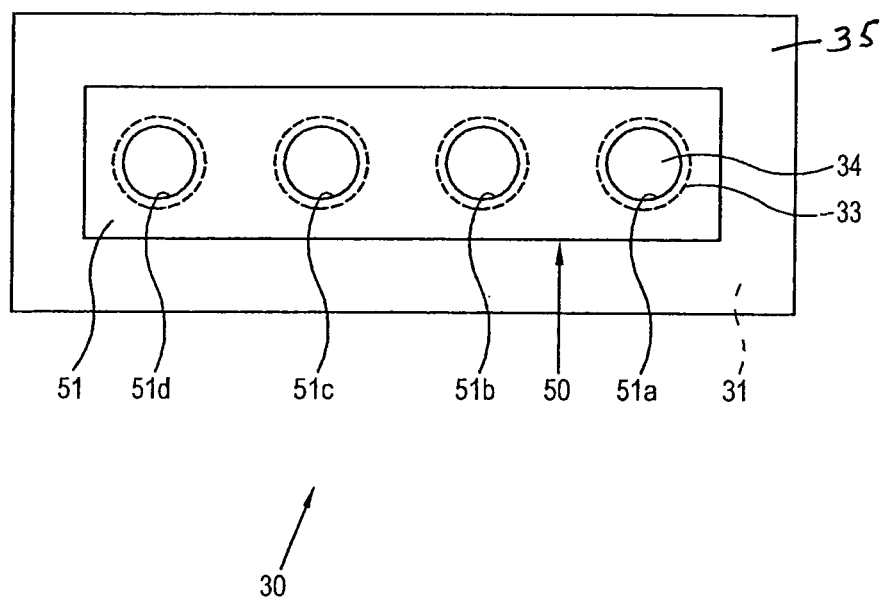
FIG. 5 is a plane view illustrating a light outputting device according to a third embodiment of the present invention.

FIG. 5 is a plane view illustrating a light outputting device 30 according to a third embodiment of the present invention. As shown in FIG. 5, the light outputting device 30 includes a substrate 31, a plurality of VCSELs 33 provided on the substrate 31, an isolator 35 electrically and optically isolating each VCSEL 33, and a monitoring detector 50. In comparison with the light outputting device 20 shown in FIG. 3, the monitoring detector 50 of the light outputting device 30 shown in FIG. 5 has a distinct configuration, and other components thereof may have the substantially same configurations as the components described above in connection with the light outputting device 20 shown in FIG. 3.

The monitoring detector 50 includes at least one light detecting unit 51 to receive lights emitted from at least two light emitting surfaces 34 of each VCSEL 33. FIG. 5 exemplarily illustrates the light outputting device 30 including four VCSELs 33 disposed in a 1×4 arrangement, and a single light detecting unit 51 to receive all the lights emitted from the light emitting surface 34 of the four VCSELs 33. In this example, the light detecting unit 51 is formed with four apertures 51a, 51b, 51c and 51d that the light emitted from the light emitting surface 34 is transmitted through. Accordingly, the light outputting device 30 shown in FIG. 5 simplifies coupling of the monitoring detector 50, and simplifies the electric wiring of the light outputting device 30. On the other hand, since the amount of the light emitted from each VCSEL 33 is incapable of being independently monitored if the four VCSELs are concurrently driven, the four VCSELs 33 are driven in sequence so that the driven VCSELs 33 can be monitored in controlling the light output. For example, in employing the light outputting device 30 as a multi beam light scanning apparatus, the four VCSELs 33 are driven in sequence to monitor the amount of the light output from each VCSEL 33 in a sample/holder process.

FIG. 6 is a partial perspective view illustrating a light outputting device 60 according to a fourth exemplary embodiment of the present invention, and FIG. 7 is a plane view of the light outputting device 60 shown in FIG. 6. As shown in FIG. 6, the light outputting device 60 includes a substrate 61, a plurality of VCSELs 63 provided on the substrate 61, an isolator 65 electrically and optically isolating each VCSEL 63, and a monitoring detector 70. In comparison with the light outputting device 20 shown in FIG. 3, the monitoring detector 70 of the light outputting device 60 shown in FIG. 6 has a distinct configuration, and other components thereof may have the substantially same configurations as the configurations of the corresponding components of the light outputting device 20 shown in FIG. 3.

The monitoring detector 70 includes a plurality of light detecting units 71, 73, 75 and 77 provided on a light emitting surface 64 of each VCSEL 63. Each of the light detecting units 71, 73, 75 and 77 is disposed to cover a partial portion or an upper surface of the corresponding light emitting surface 64. Accordingly, most of the amount of the light emitted from the light emitting surface 64 is used for an inherent function of the light outputting device, e.g., a scanning operation, while a remaining part of the light enters each light detecting unit 71, 73, 75 and 77 to be used for detecting and monitoring operations.

Since the light outputting device 60 shown in FIG. 6 is capable of independently receiving the light emitted from each VCSEL 63 by the plurality of light detecting units 71, 73, 75 and 77, the light output of all of the VCSELs 63 can be concurrently monitored. As shown in FIG. 6, a plurality of VCSELs 63 are exemplarily described. Alternatively, a single VCSEL 63 may be employed.

FIG. 8 is a plane view illustrating a light outputting device 62 according to a fifth exemplary embodiment of the present invention. As shown in FIG. 8, the light outputting device 62 according to the fifth embodiment of the present invention includes a substrate 61, a plurality of VCSELs 63 provided on the substrate 61, an isolator 65 electrically and optically isolating each VCSEL 63, and a monitoring detector 80. In comparison with the light outputting device 30 shown in FIG. 5, the monitoring detector 80 of the light outputting device 62 shown in FIG. 8 has a distinct configuration, and other components thereof may have substantially the same configurations as the configurations of the light outputting device 30 shown in FIG. 5.

The monitoring detector 80 includes at least one light detecting unit 81 to receive lights emitted from at least two light emitting surfaces 64 of each VCSEL 63. FIG. 8 exemplarily illustrates the light outputting device 62 including four VCSELs 63 disposed in a 1×4 arrangement, and a single light detecting unit 81 to receive a portion of each of the lights emitted from the light emitting surface 64 of the four VCSELs 63. Here, the light detecting unit 81 is disposed to cover a partial portion of an upper surface of each light emitting surface 64. Accordingly, most of the amount of the light emitted from the light emitting surface 64 is used for an inherent function of the light outputting device 62, such as, for example, a scanning function, and a remaining part of the light enters the light detecting unit 81 to be used for a monitoring operation.

As described above, since the light outputting devices 10, 20, 30, 60 and 62 according to aspects of the present invention directly receive the light emitted from the light emitting surface of a VCSEL to perform a monitoring operation, a divergent angle of the light emitted from the VCSEL has no effect thereon. Accordingly, a signal property of a detected light signal which is used to perform a monitoring operation can be improved. Also, since the monitoring detectors 15, 40, 50, 70 and 80 are separately manufactured from the VCSEL to be coupled thereto, the light outputting devices 10, 20, 30, 60 and 62 according to aspects of the present invention can be designed in a compact fashion without changing a substrate configuration. Also, according to aspects of the present invention, a plurality of VCSELs, such as, for example, the plurality of VCSELs 33 shown in FIG. 5, is arranged on a single substrate so that a plurality of light beams can be concurrently emitted. Also, another aspect of the present invention provides a metal layer, such as the metal layer 21 shown in FIG. 2, to prevent a light from entering an outer surface of the monitoring detector, such as the monitoring detector 15 shown in FIG. 2, so that adverse effects caused by a diffused reflection from the outside are minimized.

Figure 9:
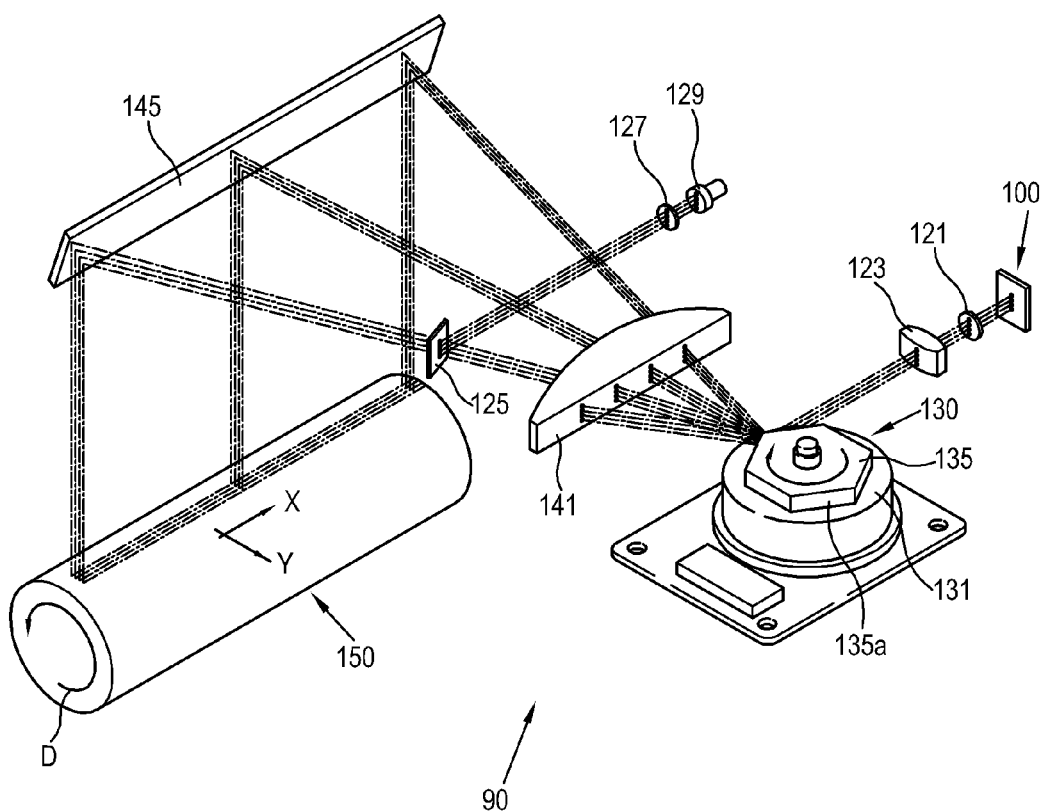
FIG. 9 is a schematic perspective view illustrating an optical disposition of a light scanning unit according to an exemplary embodiment of the present invention.

FIG. 9 is a schematic perspective view illustrating an optical disposition of a light scanning unit 90 according to an exemplary embodiment of the present invention.

As shown in FIG. 9, the light scanning unit 90 scans a light against a photosensitive medium 150, such as a photosensitive drum, which moves in a rotational direction D. The light scanning unit 90 includes a light outputting device 100 to emit a laser beam, and a beam deflecting unit 130 to deflect the laser beam emitted by the light outputting device 100 in a main scanning direction X of the photosensitive medium 150.

The light outputting device 100 may have the same configuration as any of the light outputting devices 10, 20, 30, 60 and 62 according to the first through fifth exemplary embodiments of the present invention described above in connection with FIGS. 2 to 8. FIG. 9 exemplarily illustrates the light outputting device 100 emitting multi beams. However, it is understood that the light outputting device 100 is not required to emit multi, i.e., multiple, light beams, and may instead emit only a single light beam.

The beam deflecting unit 130 deflects the light emitted by the light outputting device 100 in the main scanning direction X of the photosensitive medium 150. The beam deflecting unit 130 may be provided as a polygon mirror device as shown therein, although is not limited thereto. The polygon mirror device includes a driving source 131 and a polygon mirror 135 which rotates with respect to the driving source 131. The polygon mirror 135 includes a plurality of reflecting surfaces 135a formed on sides thereof, and rotates to deflect an incident light. According to the present embodiment, the beam deflecting unit 130 employs the polygon mirror device having the above configuration. Alternatively, the beam deflecting unit 130 may employ a hologram disk type beam deflecting unit, a galvano mirror type scanning device, etc.

A collimating lens 121 and a cylindrical lens 123 may be further provided on a light path between the light outputting device 100 and the beam deflecting unit 130. The collimating lens 121 collects a light beam emitted from the light outputting device 100 and collimates the light beam into a parallel beam or a convergent beam. The cylindrical lens 123 collects the beam transmitted through the collimating lens 121 in a direction corresponding to the main scanning direction and/or a sub scanning direction to linearly image the incident beam on the beam deflecting unit 130, and includes at least one lens.

The light scanning unit 90 shown in FIG. 9 may further include an f-θ lens 141 and a synchronizing signal detector. The f-θ lens 141 is disposed between the beam deflecting unit 130 and the photosensitive medium 150. The f-θ lens 141 includes at least one lens, and corrects the light deflected by the beam deflecting unit 130 to have different magnifying powers in the main scanning direction and the sub scanning direction to be imaged on the photosensitive medium 150.

The synchronizing signal detector receives a part of the beam emitted from the light outputting device 100 to be used in aligning a horizontal synchronization of a scanning beam. For this, the synchronizing signal detector includes a synchronizing signal sensor 129 to receive a part of the beam deflected by the beam deflecting unit 130 and transmitted through the f-θ lens 141, a mirror 125 disposed between the f-θ lens 141 and the synchronizing signal sensor 129 to change a proceeding path of an entering beam, and a collecting lens 127 to collect the beam reflected by the mirror 125.

Also, a reflecting mirror 145 may be further provided between the f-θ lens 141 and the photosensitive medium 150. The reflecting mirror 145 reflects the scanning beam transmitted from the beam deflecting unit 130 so that the scanning beam can be formed on the photosensitive medium 150.

The light scanning unit 90 according to aspects of the present invention employs the light outputting device 100 having the above configuration as a light source to scan a single beam or multi beams in a stable fashion. Also, in the case of scanning the multi beams, the light scanning unit 100 according to aspects of the present invention reduces a light output difference among the multi beams to reduce image inferiority caused by the light output difference among the multi beams.

As described above, in the light outputting device according to aspects of the present invention, since a monitoring detector is coupled on a VCSEL, the light outputting device has a compact design without a substrate configuration. Also, since a light emitted from a light emitting surface of the VCSEL is directly received to perform a monitoring operation, a divergent angle of the light emitted from the VCSEL has no adverse effects on the monitoring operation. Accordingly, a signal property of a detected light signal used to perform the monitoring operation is improved.

Also, according to another aspect of the present invention, a plurality of VCSELs is arranged on a single substrate so that a plurality of light beams can be concurrently emitted. Also, another aspect of the present invention provides a metal layer to prevent a light from entering an outer surface of the monitoring detector from the outside so that adverse effects caused by a diffused reflection are minimized.

Also, according to another aspect of the present invention, since the monitoring detector is formed on the VCSEL so that a light guiding can be elongated, a divergent angle variation of the light beam emitted from the VCSEL is reduced. Also, according to another aspect of the present invention, the monitoring detector directly receives the light outputted from the VCSEL to minimize loss of the light beam used to perform the monitoring operation. Accordingly, a light output of the VCSEL can be controlled in a more stable fashion.

Also, a light scanning unit according to aspects of the present invention employs the light outputting device having the above configuration as a light source to scan a single beam or multi beams in a stable fashion. Also, in case of scanning the multi beams, the light scanning unit according to aspects of the present invention reduces a light output difference among the multi beams to reduce image inferiority caused by the light output difference among the multi beams.

While there have been illustrated and described what are considered to be example embodiments of the present invention, it will be understood by those skilled in the art and as technology develops that various changes and modifications, may be made, and equivalents may be substituted for elements thereof without departing from the true scope of the present invention. Many modifications, permutations, additions and sub-combinations may be made to adapt the teachings of the present invention to a particular situation without departing from the scope thereof. For example, in the light outputting device shown in FIG. 5, the light detecting unit 51 is not limited to covering four of the VCSELs 33, and there may instead be provided two light detecting units 51 to each cover two of the VCSELs 33, etc. Furthermore, the monitoring detector is not limited to being physically in contact with the light emitting surface in all aspects, and may instead be spaced apart from the light emitting surface. Accordingly, it is intended, therefore, that the present invention not be limited to the various example embodiments disclosed, but that the present invention includes all embodiments falling within the scope of the appended claims.

What is claimed is:

1. A light scanning unit, comprising:
a substrate;
a plurality of vertical cavity surface emitting lasers (VCSELs) which are respectively provided at a plurality of positions on a surface of the substrate, each VCSEL comprising a light emitting surface which emits a light, each of said light emitting surfaces having a first, peripheral portion and a second, interior portion;
an isolator which is provided to electrically and optically isolate each VCSEL on the substrate and to directly contact the substrate;
a monitoring detector provided on only the isolator and the first, peripheral portion of each light emitting surface to receive directly only a part of the light emitted from each VCSEL so as to monitor an amount of the light emitted from each VCSEL,
wherein a remainder of the light passes through the second, interior portion of each light emitting surface; and
a beam deflecting unit which deflects the remainder of the light emitted from each of the respective VCSELs in a main scanning direction of a photosensitive medium,
wherein the light emitting surface emits the light beam in a vertical direction to the substrate, and
wherein the entire light emitting surface having the first, peripheral portion and the second, interior portion is flat and parallel to the substrate.

2. The light scanning unit according to claim 1, wherein the monitoring detector comprises a plurality of light detecting units which are respectively provided on corresponding light emitting surfaces of the plurality of VCSELs.

3. The light scanning unit according to claim 2, wherein each light detecting unit is formed with an aperture through which the remainder of the light emitted from the light emitting surface passes.

4. The light scanning unit according to claim 1, wherein the monitoring detector comprises at least one light detecting unit which receives the part of the light emitted from at least two of the light emitting surfaces among the light emitting surfaces of the VCSELs.

5. The light scanning unit according to claim 1, further comprising an insulating layer which is interposed between the VCSELs and the monitoring detector to electrically insulate the VCSELs and the monitoring detector and to transmit the light generated from each of the VCSELs to the monitoring detector.

6. The light scanning unit according to claim 1, further comprising a metal layer which is provided on the monitoring detector to prevent an external light from entering the monitoring detector.

7. A light outputting device, comprising:
a substrate;
a vertical cavity surface emitting laser (VCSEL) provided on a surface of the substrate, comprising a light emitting surface through which a light is emitted;
a monitoring detector arranged to directly receive a part of the light emitted from the light emitting surface so as to monitor an amount of the light emitted directly from the VCSEL; and
an insulating layer which is interposed between the VCSEL and the monitoring detector to electrically insulate the VCSEL and the monitoring detector,
wherein the monitoring detector is formed with an aperture therein which enables a transmission of the light emitted from the light emitting surface therethrough,
wherein the aperture is formed to pass through the monitoring detector, and
wherein the entire light emitting surface is flat and parallel to the substrate, the monitoring detector and the aperture are disposed on the light emitting surface.

8. The light outputting device according to claim 7, wherein the aperture is formed by an etching process after the monitoring detector is coupled to the VCSEL.

9. The light outputting device according to claim 7, wherein the insulating layer comprises polyimide.

* * * * *